(12) United States Patent
Conley, Jr. et al.

(10) Patent No.: US 7,589,464 B2
(45) Date of Patent: Sep. 15, 2009

(54) NANOTIP ELECTRODE ELECTROLUMINESCENCE DEVICE WITH CONTOURED PHOSPHOR LAYER

(75) Inventors: John F. Conley, Jr., Camas, WA (US); David R. Evans, Beaverton, OR (US); Wei Gao, Vancouver, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 695 days.

(21) Appl. No.: 11/070,051

(22) Filed: Mar. 1, 2005

(65) Prior Publication Data

US 2006/0197438 A1  Sep. 7, 2006

(51) Int. Cl.
*H05B 33/26* (2006.01)
(52) U.S. Cl. ...................... 313/509; 313/501
(58) Field of Classification Search ......... 313/498–512; 315/169.3; 345/36, 45, 76
See application file for complete search history.

(56) References Cited

U.S. PATENT DOCUMENTS

| | | | |
|---|---|---|---|
| 4,774,435 A * | 9/1988 | Levinson | 313/509 |
| 2003/0190410 A1 | 10/2003 | Cranton et al. | 427/66 |
| 2004/0017152 A1 * | 1/2004 | Hashimoto et al. | 313/505 |
| 2005/0269576 A1 * | 12/2005 | Park et al. | 257/79 |
| 2006/0180817 A1 * | 8/2006 | Hsu et al. | 257/79 |

FOREIGN PATENT DOCUMENTS

JP  54081790 A  *  6/1979
JP  04141983 A  *  5/1992

OTHER PUBLICATIONS

C.M. Lieber, "Nanoscale science and technology: Building a big future from small things," MRS Bulletin, p. 486-491, (Jul. 2003).
P. Yang, H. Yan, S. Mao, R. Russo, J. Johnson, R. Saykally, N. Morris, J. Pham, R. He, and H.J. Choi, "Controlled growth of ZnO nanowires and their optical properties," Adv. Func. Mat. 12(5), 323 (2002).
Y.A. Ono, *Electroluminescent Displays*, World Scientific, River Edge, NJ, (1995).

* cited by examiner

*Primary Examiner*—Nimeshkumar D. Patel
*Assistant Examiner*—Christopher M Raabe
(74) *Attorney, Agent, or Firm*—Law Office of Gerald Maliszewski; Gerald Maliszewski

(57) ABSTRACT

A device and a fabrication method are provided for an EL device with a nanotip-contoured phosphor layer. The method comprises: forming a bottom electrode with nanotips; forming a phosphor layer overlying the bottom electrode, having irregularly-shaped top and bottom surfaces; and, forming a top electrode overlying the phosphor layer. The bottom electrode top surface has a nanotip contour, and the phosphor layer irregularly-shaped top and bottom surfaces have contours approximately matching the bottom electrode top surface nanotip contour. In one aspect, a contoured bottom dielectric is interposed between the bottom electrode and the phosphor layer, having top and bottoms surfaces with contours approximately matching the nanotip contour. Likewise, a top dielectric may be interposed between the top electrode and the phosphor layer, having a bottom surface with a contour approximately matching the contour of phosphor layer top surface.

15 Claims, 5 Drawing Sheets

NANOTIP ELECTRODE ELECTROLUMINESCENCE DEVICE WITH CONTOURED PHOSPHOR LAYER

BACKGROUND OF THE INVENTION

1. Field of the Invention

This invention generally relates to integrated circuit (IC) fabrication and, more particularly, to an electroluminescence (EL) device made using a nanotip electrode, with a nanotip-contoured phosphor layer.

2. Description of the Related Art

The generation of light from semiconductor devices is possible, regardless of whether the semiconductor material forms a direct or indirect bandgap. High field reverse biased p-n junctions create large hot carrier populations that recombine with the release of photons. For silicon devices, the light generation efficiency is known to be poor and the photon energy is predominantly around 2 eV. The conversion of electrical energy to optical photonic energy is called electroluminescence (EL). Efficient EL devices have been made that can operate with small electrical signals, at room temperature. However, these devices are fabricated on materials that are typically not compatible with silicon, for example type III-V materials such as InGaN, AlGaAs, GaAsP, GaN, and GaP. An EL device built on one of these substrates can efficiently emit light in a narrow bandwidth within the visible region, depending on the specific material used. Additionally, type II-VI materials such as ZnSe have been used. Other type II-VI materials such as ZnS and ZnO are known to exhibit electroluminescence under ac bias conditions. These devices can be deposited onto silicon for use in light generating devices if special (non-conventional) CMOS processes are performed. Other classes of light emitting materials are organic light emitting diodes (OLEDs), nanocrystalline silicon (nc-Si), and polymer LEDs.

Silicon has conventionally been considered unsuitable for optoelectronic applications, due to the indirect nature of its energy band gap. Bulk silicon is indeed a highly inefficient light emitter. Among the different approaches developed to overcome this problem, quantum confinement in Si nanostructures and rare earth doping of crystalline silicon have received a great deal of attention.

A simple and efficient light-emitting device compatible with silicon would be desirable in applications where photonic devices (light emitting and light detecting) are necessary. Efficient silicon substrate EL devices would enable a faster and more reliable means of signal coupling, as compared with conventional metallization processes. Further, for intra-chip connections on large system-on-chip type of devices, the routing of signals by optical means is also desirable. For inter-chip communications, waveguides or direct optical coupling between separate silicon pieces would enable packaging without electrical contacts between chips. For miniature displays, a method for generating small point sources of visible light would enable simple, inexpensive displays to be formed.

FIG. 1 is a partial cross-sectional view of a thin-film, solid-state Si phosphor EL device (prior art). EL devices compatible with Si are currently being sought for a number of applications such as optical interconnects. An AC EL device may consist of a substrate 1, an optional bottom electrode 2, a phosphor layer 4, sandwiched by a top 5 and bottom 3 dielectric layer, and a top transparent electrode 6. Such a device typically requires high operating fields in order to inject electrons from states at the interface into the phosphor layer. The electrons are then, accelerated by the field, gaining energy until they radiatively decay at luminescent centers. As shown, all layers in these devices are planar.

Nanostructured materials such as nanowires, nanorods, and nanoparticles, have potential for use in applications such as nanowire chemical and bio sensors, nanowire LEDs, nanowire transistors, nanowire lasers, to name a few examples. Materials such as Si, Ge, other elemental semiconductors, ZnO, and other binary semiconductors have been made into nanostructures. One of the primary methods for nanowire formation is the vapor-liquid solid transport method with which a catalyst can be used to grow a nanowire from the gas phase. Other methods have also been used.

To aid in the generation of photoluminescence (PL), nanostructured electrodes have been used to develop higher intensity fields in Si compatible phosphor materials. For example, Hsu et al., in SILICON PHOSPHOR ELECTROLUMINESCENCE DEVICE WITH NANOTIP ELECTRODE, Ser. No. 11/061,946, filed on Feb. 17, 2005, assigned to the same assignee as the instant application, describes EL devices made using iridium oxide nanotips. It would be desirable if PL intensity could be further improved by continuing the development of EL nanostructures. However, the high surface area inherent to a nanostructures creates problems in conformally covering the nanotip surfaces. This conformality problem, in turns, can result in the formation of gaps and air pockets between the nanotip electrode and the overlying phosphor layer.

It would be advantageous if the intensity of a Si compatible phosphor EL device could be enhanced through the formation of nanostructures.

It would be advantageous if the Si phosphor layer of an EL device could be contoured to match the shape of a nanotip electrode.

SUMMARY OF THE INVENTION

Described herein is an application of a nanostructured nanorod material bottom electrode for an EL device. Although ITO has long been used as an electrode for these devices, it has typically been planar in character. It is well known that the surface charge density is enhanced at sharp geometries in conductors, increasing the surrounding electric field. It has recently been shown that sharp geometry nanostructural materials such as nanotubes and nanowires are efficient field emitters.

The nanostructured ITO electrode is covered with nanorods. These are rod-shaped, sharp-tipped nanostructures that serve to enhance the field emission of electrons into the phosphor layer of these devices. This electrode permits a reduction in the operating voltage and in the luminescence threshold of these EL devices. Further, the phosphor material overlying the electrode is contoured to approximately match the shape of the nanorods.

Accordingly, a method is provided for fabricating an EL device with a nanotip-contoured phosphor layer. The method comprises: forming a bottom electrode with nanotips; forming a phosphor layer overlying the bottom electrode, having irregularly-shaped top and bottom surfaces; and, forming a top electrode overlying the phosphor layer. As noted above, the bottom electrode top surface has a nanotip contour. Therefore, the phosphor layer irregularly-shaped top and bottom surfaces have contours approximately matching the bottom electrode top surface nanotip contour. In one aspect, the top electrode has a bottom surface with a contour approximately matching the contour of the phosphor layer top surface.

The phosphor layer can be a material such as ZnO, ZnS:Mn, silicon-rich oxide (SRO), doped ZnO, doped ZnS, or doped SRO. The bottom electrode can be a transparent material such as ITO or ZnO:Al. If the top electrode is transparent, then the bottom electrode may be a non-transparent material such as a metal, or a conductive metal oxide, such as iridium oxide (IrOx).

In another aspect, a contoured bottom dielectric is interposed between the bottom electrode and the phosphor layer, having top and bottoms surfaces with contours approximately matching the nanotip contour. The bottom dielectric may be a material such as HfO2, AL2O3, or SiO2, to name a few examples. Likewise, a top dielectric may be interposed between the top electrode and the phosphor layer, having a bottom surface with contour approximately matching the contour of phosphor layer top surface. In one aspect, the top dielectric has a top surface that is planarized. Meaning that the top electrode bottom surface is planar.

Additional details of the above-described method, and an EL device with a nanotip-contoured phosphor layer, are provided below.

DETAILED DESCRIPTION

Figure 1:
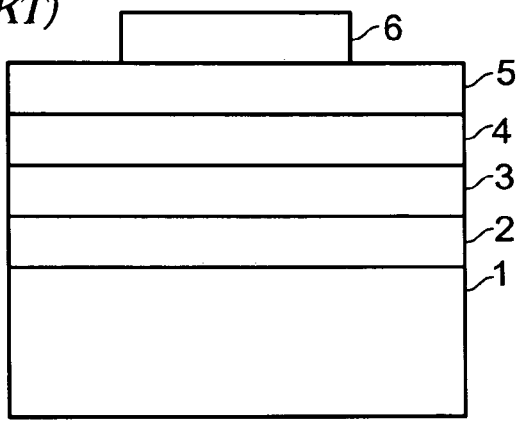
FIG. 1 is a partial cross-sectional view of a thin-film, solid-state Si phosphor EL device (prior art).
Figure 2:
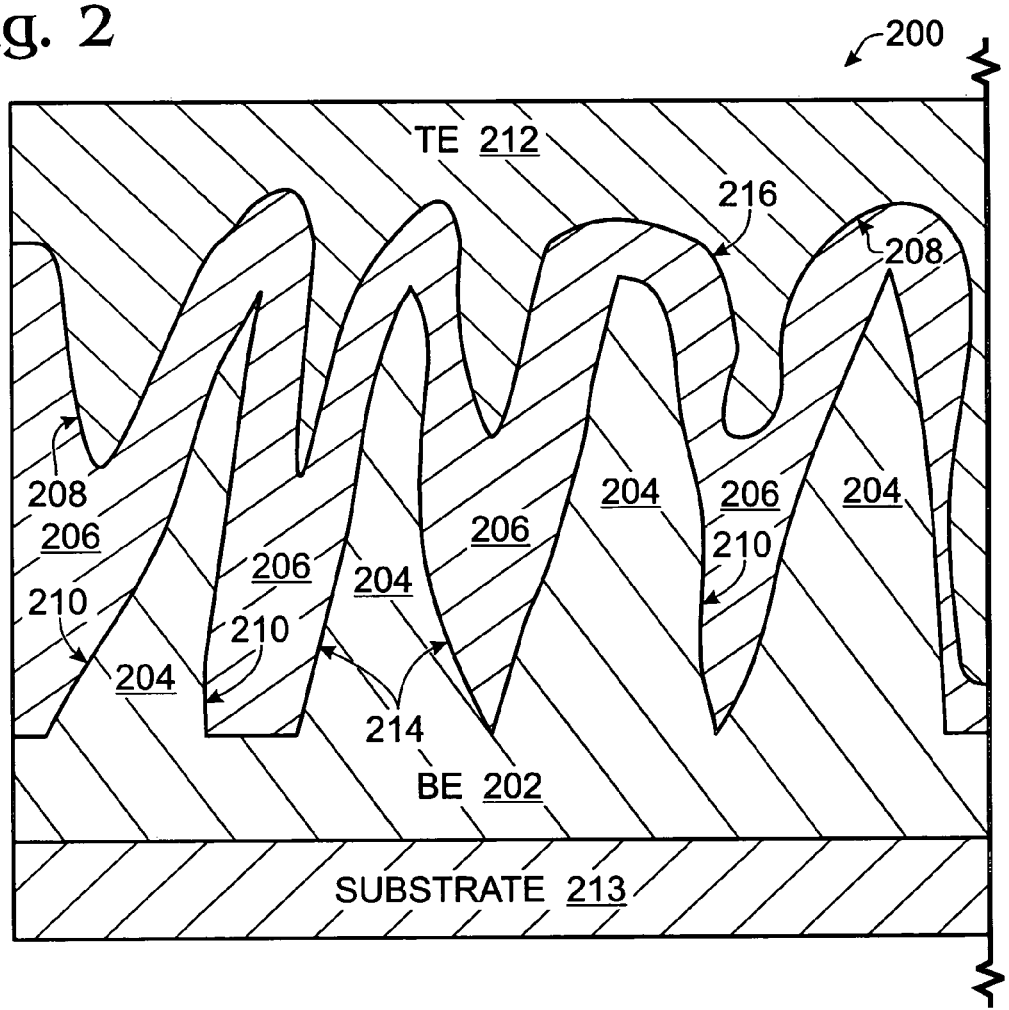
FIG. 2 is a partial cross-sectional, detailed view of an electroluminescence (EL) device with a nanotip-contoured phosphor layer.

FIG. 2 is a partial cross-sectional, detailed view of an electroluminescence (EL) device with a nanotip-contoured phosphor layer. The EL device 200 comprises a bottom electrode (BE) 202 with nanotips 204. A phosphor layer 206 overlies the bottom electrode 202, having an irregularly-shaped top surface 208 and an irregularly-shaped bottom surfaces 210. A top electrode 212 overlies the phosphor layer 206.

A substrate 213 underlies the bottom electrode 202, made from a material such as silicon, silicon oxide, silicon nitride, glass, quartz, or plastic. In one aspect, the substrate 213, bottom electrode 202, and nanotips 204 are a transparent material, while the top electrode is a non-transparent material. In another aspect, the top electrode 212 is transparent, while the bottom electrode 202 and substrate 213 are non-transparent. In yet another aspect, the substrate 213, bottom electrode 202, and top electrode 212 are all transparent.

As used herein, the word "nanotip" is not intended to be limited to any particular physical characteristics, shapes, or dimensions. The nanotips may alternately be known as nanorods, nanotubes, or nanowires. In some aspects (not shown), the nanotips may form a hollow structure. In other aspects (not shown), the nanotips may be formed with a plurality of tips ends.

The phosphor layer 206 can be a material such as ZnO, ZnS:Mn, silicon-rich oxide (SRO or SRSO), doped ZnO, doped ZnS:Mn, or doped SRO. The top electrode 212 can be a transparent material such as ITO, ZnO:Al, a wide band gap conductive oxide, or a thin transparent film of a conductive metal. If non-transparent, the top electrode is typically a conductive metal, although other conventional materials may be used.

Figure 3:
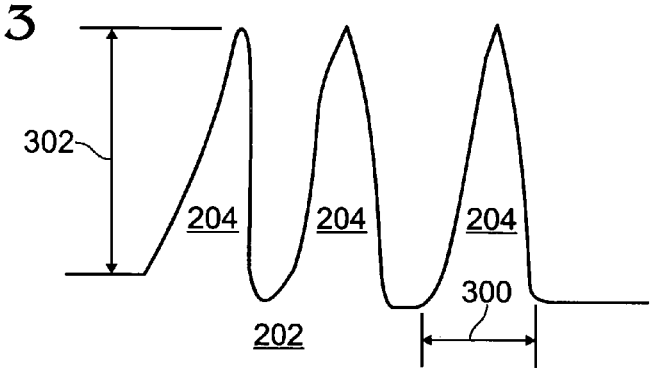
FIG. 3 is a partial cross-sectional view of the device of FIG. 2, depicting some nanotips details.

FIG. 3 is a partial cross-sectional view of the device of FIG. 2, depicting some nanotips details. The nanotips 204 have a tip base size 300 of about 50 nanometers, or less. The nanotips 204 have a tip height 302 in the range of 5 to 500 nm.

In one aspect, the nanotips 204 are made from indium tin oxide (ITO). Although ITO nanotips are used to illustrate to illustrate the invention, nanotips can be formed from the conductive oxides of other transition metals. The bottom electrode 202 and nanotips 204 can be other transparent materials, such as Al doped zinc oxide (ZnO:Al). In other aspects, the bottom electrode 202 and nanotips 204 may be non-transparent material such as a metal, or a conductive metal oxide, such as IrOx.

Returning to FIG. 2, it can be seen that the bottom electrode 202 has a top surface 214 with a nanotip contour. The phosphor layer top surface 208 has a contour approximately matching the bottom electrode top surface 214 nanotip contour. Likewise, the phosphor layer bottom surface 210 has a contour approximately matching the bottom electrode top surface 214 nanotip contour. The phosphor layer top and bottom surfaces 208/210 may have a surface irregularity in the range of 5 to 500 nanometers (nm), where a surface irregularity is the flatness variation in the surface. Therefore, depending upon the conformality achieved, the surface irregularity can be as great as the nanotip height (see FIG. 3). In some aspects as shown, details of the bottom electrode top surface nanotip contour may be lost in transition through each overlying surface. Thus, the Si phosphor layer top surface 208 may be a contour that has fewer details of the nanotip contour than the bottom surface 210 and, therefore, less surface-irregularity.

The loss of contour details between surfaces is due to strains between different layers of materials and anisotropic deposition characteristics. For this reason, the Si phosphor surface contours are said to approximately match the nanotip contours. As shown, the top electrode 212 has a bottom surface 216 with a contour approximately matching the contour of the phosphor layer top surface 208.

Figure 4:
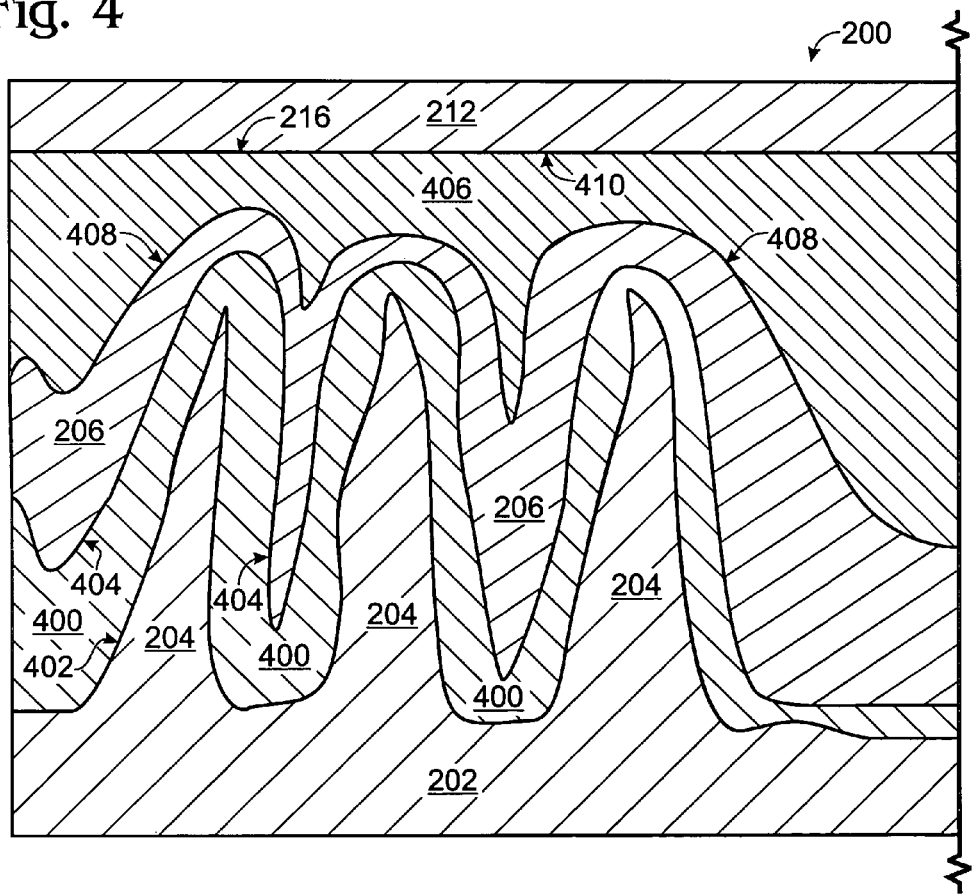
FIG. 4 is a partial cross-sectional view of a variation of the El device of FIG. 2.

FIG. 4 is a partial cross-sectional view of a variation of the El device of FIG. 2. A contoured bottom dielectric 400 is interposed between the bottom electrode 202 and the phosphor layer 206. The bottom dielectric has a top surface 402 and a bottom surface 404, both with contours approximately matching the nanotip contour of the bottom electrode top surface 214. The bottom dielectric 400 can be a material such as HfO2, Al2O3, SiO2, binary metal oxides, trinary metal oxides, or metal silicates.

In another aspect a top dielectric 406 is interposed between the top electrode 212 and the phosphor layer 206. The top dielectric 406 has a bottom surface 408 with a contour approximately matching the contour of phosphor layer top surface 208. The top dielectric 406 has a planar top surface 410. The top dielectric 406 can be made from a material such as SiO2, SiON, binary metal oxides, trinary metal oxides, or metal silicates.

Functional Description

FIGS. 5 and 7 through 11 are views depicting steps in the completion of the present invention EL device. As described above, an AC electroluminescent device can be formed (bottom to top) as a substrate/nanostructured bottom electrode/ bottom dielectric/phosphor/top dielectric/transparent top electrode. The substrate 500 can be Si or a glass wafer. Assuming a Si substrate is formed, an appropriate surface cleaning, such as a standard RCA clean is performed, followed by a (hydrofluoric acid) HF step. Then, a nanostructured conductive bottom electrode 502, such as ITO, is deposited. As shown, the surface of the ITO film 502 is covered with crystalline triangular ITO nanorods (nanotips).

Figure 6:
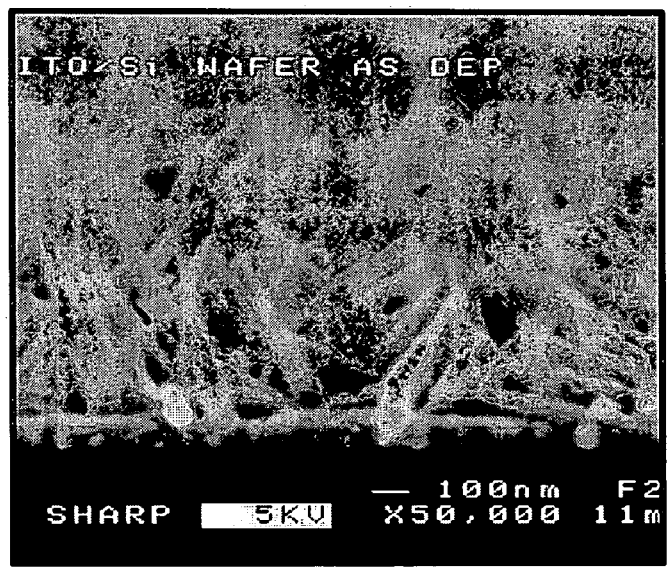
FIG. 6 is a scanning electron microscope (SEM) image of nanorods.

FIG. 6 is a scanning electron microscope (SEM) image of nanorods. The SEM image reveals that the nanorods are about 0.5 micrometers (um) in length and are about 0.1 um wide at the base, coming to a point at the end. Nanorods of other dimensions can be used. The conductive bottom electrode need not be ITO, but can be any other material that can be formed into a suitable nanostructured surface similar to the one pictured. Any deposition technique that results in a nanowire, nanotip, or nanorod surface can also be used.

Figure 5:
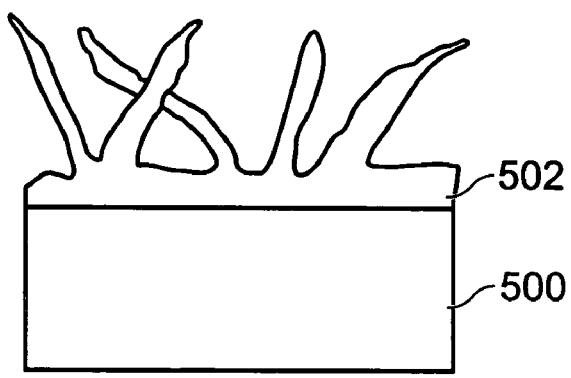
FIGS. 5 and 7 through 11 are views depicting steps in the completion of the present invention EL device.
Figure 7:
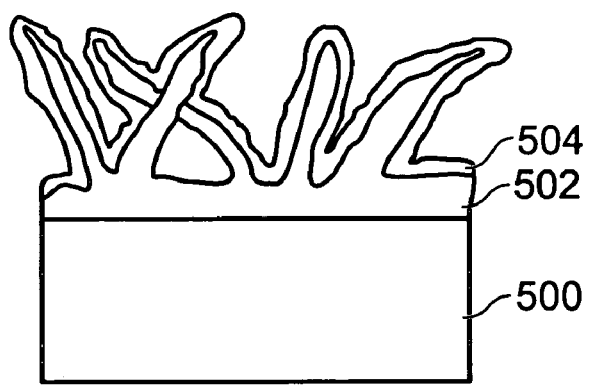

FIG. 7 is the EL device of FIG. 5, following the deposition of a bottom dielectric material. The next step is to deposit the bottom dielectric 504, in this case $HfO_2$, via a conformal technique such as atomic layer deposition (ALD). Alternate materials such as $SiO_2$ or other high k dielectrics can be used. Other conformal deposition techniques can also be used.

Figure 8:
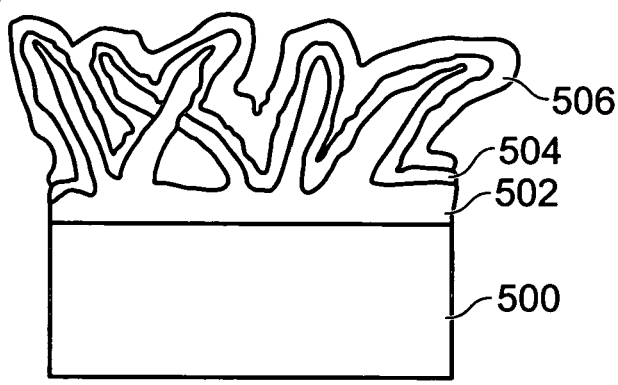

FIG. 8 is the EL device of FIG. 7, following the deposition of a phosphor. Next, the phosphor layer 506 is deposited, again by a conformal technique such as ALD. In this example, ZnO is used, but in principle, any other state-of-the-art suitable phosphor material can be used such as ZnS:Mn. Any suitable conformal deposition technique can also be used. If necessary, an appropriate anneal can be performed to activate or improve the luminescent properties of the phosphor layer. Advantageously, it is less likely that gaps or air pockets are formed when the phosphor layer is contoured over the bottom electrode nanotips, enhancing PL intensity.

Figure 9:
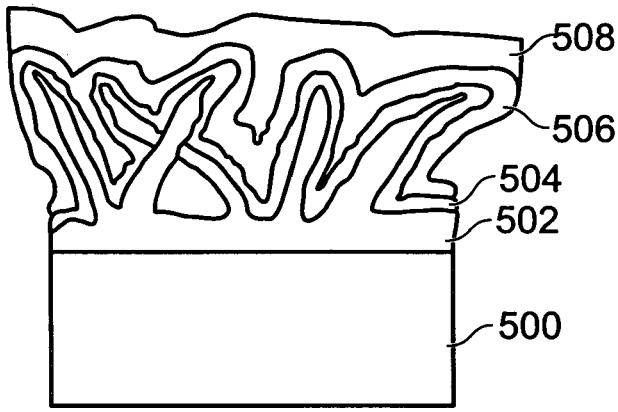
Figure 10:
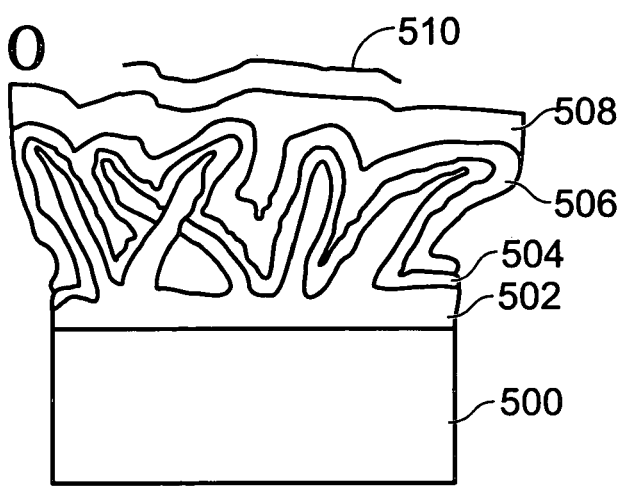

FIG. 9 is the EL device of FIG. 8, following the deposition of a top dielectric material. Next, the top dielectric layer 508 is deposited. Any dielectric material such as $SiO_2$, SiON, or high k dielectrics such as binary and trinary metal oxides can be used. For example, the material can be a spun on in order to smooth the likely rough topography of the underlying surfaces. FIG. 10 is the EL device of FIG. 9, following the deposition of a top electrode. Finally, in order to complete electrical contact to the device, a top electrode layer 510 is deposited. This material should be smooth on top and should not have a nanostructured surface. This material should be both conductive and transparent (in this aspect) in order to let light through. In the example cited, ITO is deposited via DC magnetron sputtering with process parameters specified to yield a smooth, conductive, and transparent film. In principle, any suitable state-of-the-art transparent conductive electrode can be deposited by any state-of-the-art method.

Figure 11:
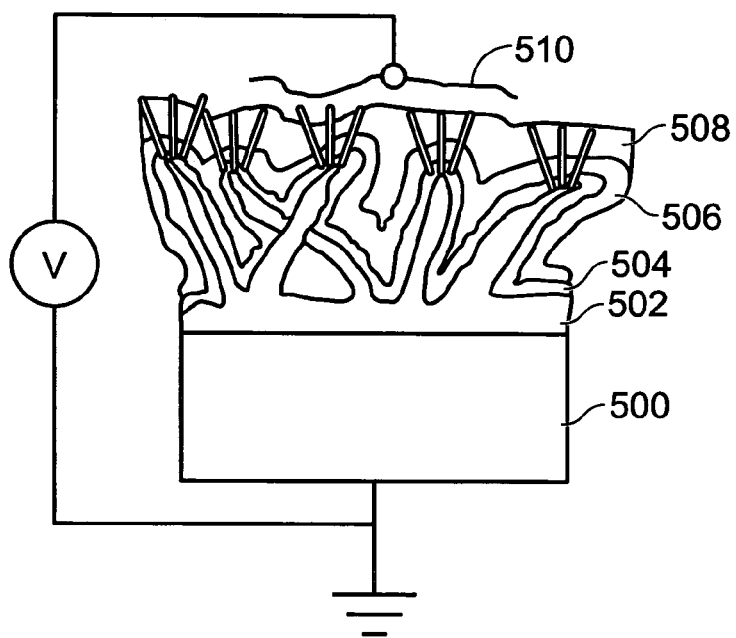

FIG. 11 is the EL device of FIG. 10, following completion of the device. When an appropriate bias or waveform is applied, the device emits light, preferentially in areas of the phosphor near the tips of the nanorods where the field is enhanced.

In another aspect, a DC-type electroluminescent device is formed by omitting the bottom dielectric layer. In another variation, the bottom dielectric layer is used, but the top dielectric layer is omitted. In another aspect, neither the bottom dielectric layer, nor the top dielectric layer is used (see FIG. 2).

In another aspects, the full structure is used as described in FIG. 11, except that a conformal dielectric film is used (such as ALD $HfO_2$, HfSiON, etc., or any other dielectric film) as the top dielectric layer, instead of the SOG film described above. In addition, a conformal conductive and transparent electrode layer (such as ALD ZnO:Al) may be used instead of a less conformal technique. This embodiment may permit the generation of light over a greater fraction of the phosphor film.

Figure 12:
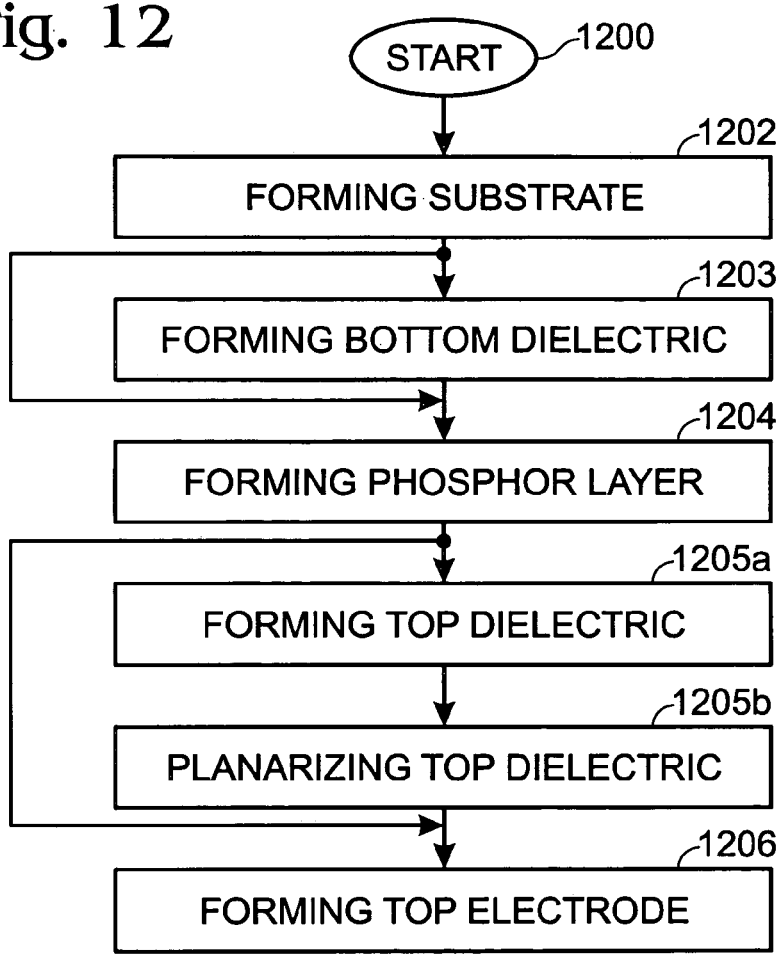
FIG. 12 is a flowchart illustrating a method for fabricating an EL device with a nanotip-contoured phosphor layer.

FIG. 12 is a flowchart illustrating a method for fabricating an EL device with a nanotip-contoured phosphor layer. Although the method is depicted as a sequence of numbered steps for clarity, the ordering of the steps does not necessarily follow the numbering. It should be understood that some of these steps may be skipped, performed in parallel, or performed without the requirement of maintaining a strict order of sequence. Some details of the method may be better understood in context of the explanations of FIGS. 1-11, above. The method starts at Step 1200.

Step 1201 forms a substrate from a material such as silicon, or transparent materials such as glass, quartz, or plastic. Step 1202 forms a bottom electrode with nanotips, from either a transparent or non-transparent material. Step 1204 forms a phosphor layer overlying the bottom electrode, having irregularly-shaped top and bottom surfaces. The contour surfaces have a surface irregularity in the range of 5 to 500 nm. In one aspect, Step 1204 forms nanotips having a tip base size of about 100 nanometers, or less, and a tip height in the range of 5 to 500 nm. Step 1206 forms a top electrode overlying the phosphor layer.

Typically, Step 1202 forms a bottom electrode top surface with a nanotip contour. Then, Step 1204 forms top and bottom surfaces with contours approximately matching the bottom electrode top surface nanotip contour. In one aspect, Step 1206 forms a top electrode having a bottom surface with a contour approximately matching the contour of the phosphor layer top surface.

The phosphor layer formed in Step 1204 can be a material such as ZnO, ZnS:Mn, SRO, doped ZnO, doped ZnS, or doped SRO. The top electrode formed in Step 1206 can be a transparent material such as ITO, ZnO:Al, wide band gap conductive oxides, or thin transparent films of conductive metals. If the top electrode is non-transparent, the material is typically a conductive metal.

The bottom electrode with nanotips of Step 1202 can be formed from a transparent material such as ITO or ZnO:Al, or from a non-transparent material such as metals, or conductive metal oxides, such as IrOx.

In one variation, Step 1203 forms a contoured bottom dielectric interposed between the bottom electrode and the phosphor layer, having top and bottoms surfaces with contours approximately matching the nanotip contour. The bottom dielectric can be a material such as HfO2, AL2O3, SiO2, other binary metal oxides, trinary metal oxides, or metal silicates. The bottom dielectric may be formed using a deposition process such as atomic layer deposition (ALD), chemical vapor deposition (CVD), spin on deposition, or sputter deposition.

In another variation, Step 1205a forms a top dielectric interposed between the top electrode and the phosphor layer, having a bottom surface with a contour approximately matching the contour of phosphor layer top surface. Step 1205b planarizes the top surface of the top dielectric. The top dielectric can be a material such as SiO2, SiON, binary metal oxides, trinary metal oxides, or metal silicates. In one aspect, the top dielectric can be formed using a spin on glass (SOG) process.

An EL device made with a nanotip electrode and contoured phosphor layer, and a corresponding fabrication process has been provided. Specific materials and fabrication details have been given as examples to help illustrate the invention. However, the invention is not limited to merely these examples. Other variations and embodiments of the invention will occur to those skilled in the art.

We claim:

1. A method for fabricating an electroluminescence (EL) device with a nanotip-contoured phosphor layer, the method comprising:
    providing a substrate with a planar top surface, made from a material selected from the group including silicon, glass, quartz, and plastic;
    forming a bottom electrode having a planar bottom surface overlying the substrate planar top surface, and a top surface with nanotips;
    forming a phosphor layer overlying the bottom electrode, having a bottom surface with a contour matching the bottom electrode nanotip contour, and a top surface with a contour matching the phosphor layer bottom surface contour;
    forming a contoured bottom dielectric interposed between the bottom electrode and the phosphor layer, having top and bottoms surfaces with contours matching the nanotip contour; and
    forming a top electrode overlying the phosphor layer.

2. The method of claim 1 wherein forming the top electrode includes forming a top electrode having a bottom surface with a contour matching the contour of the phosphor layer top surface.

3. The method of claim 1 wherein forming the bottom electrode with nanotips includes forming nanotips having a tip base size of about 100 nanometers, or less.

4. The method of claim 1 wherein forming the bottom electrode with nanotips includes forming nanotips having a tip height in the range of 5 to 500 nm.

5. The method of claim 1 wherein forming the bottom electrode with nanotips includes forming a bottom electrode and nanotips from a transparent material selected from the group of indium tin oxide (ITO) and ZnO:Al, and from a non-transparent material selected from the group of iridium oxide (IrOx), other conductive metal oxides, and metals.

6. The method of claim 1 wherein forming the bottom dielectric includes forming the bottom dielectric from a material selected from the group including $HfO_2$, $AL_2O_3$, $SiO_2$, other binary metal oxides, trinary metal oxides, and metal silicates.

7. The method of claim 6 wherein forming the bottom dielectric includes forming the bottom dielectric using a deposition process selected from the group including atomic layer deposition (ALD), chemical vapor deposition (CVD), spin on deposition, and sputter deposition.

8. The method of claim 1 further comprising:
    forming a top dielectric interposed between the top electrode and the phosphor layer, having a bottom surface with a contour matching the contour of phosphor layer top surface.

9. The method of claim 8 wherein forming the top dielectric includes forming a top dielectric with a top surface;
    the method further comprising:
    planarizing the top dielectric top surface.

10. The method of claim 8 wherein forming the top dielectric includes forming the top dielectric from a material selected from the group including $SiO_2$, SiON, binary metal oxides, trinary metal oxides, and metal silicates.

11. The method of claim 8 wherein forming the top dielectric includes forming the top dielectric using a spin on glass (SOG) process.

12. The method of claim 1 wherein forming the substrate includes forming the substrate from a transparent material; and
    wherein forming the bottom electrode with nanotips includes forming the bottom electrode and nanotips from a transparent material.

13. The method of claim 1 wherein forming the phosphor layer includes forming the phosphor layer from a material selected from the group including ZnO, ZnS:Mn, silicon-rich oxide (SRO), doped ZnO, doped ZnS, and doped SRO.

14. The method of claim 1 wherein forming the top electrode includes forming the top electrode from a transparent material selected from the group including ITO, ZnO:Al, wide band gap conductive oxides, and thin transparent films of conductive metals, and from a non-transparent conductive metals.

15. The method of claim 1 wherein forming the phosphor layer top and bottom surfaces with contours includes the contour surfaces having a surface irregularity in the range of 5 to 500nm.

* * * * *